United States Patent
Ohwa

[19]

[11] Patent Number: 5,905,676
[45] Date of Patent: May 18, 1999

[54] SEMICONDUCTOR MEMORY APPARATUS

[75] Inventor: Yoshihito Ohwa, Suwa, Japan

[73] Assignee: Seiko Epson Corporation, Tokyo, Japan

[21] Appl. No.: 09/040,278

[22] Filed: Mar. 18, 1998

[30] Foreign Application Priority Data

Mar. 24, 1997 [JP] Japan ................................ 9-070244
Jan. 29, 1998 [JP] Japan ................................ 10-032117

[51] Int. Cl.$^6$ .................................................. G11C 16/06
[52] U.S. Cl. .......................... 365/185.21; 365/185.13; 365/185.2; 365/185.23
[58] Field of Search ...................... 365/185.21, 185.13, 365/185.2, 185.23

[56] References Cited

U.S. PATENT DOCUMENTS

| 4,636,979 | 1/1987 | Donoghue | 365/104 |
| 5,386,158 | 1/1995 | Wang | 365/185.21 |
| 5,386,388 | 1/1995 | Atwood et al. | 365/185.22 |
| 5,621,686 | 4/1997 | Alexis | 365/185.21 |
| 5,684,739 | 11/1997 | Takeuchi | 365/185.03 |

FOREIGN PATENT DOCUMENTS

| 0 257 891 A2 | 3/1988 | European Pat. Off. . |
| 0 725 403 A1 | 8/1996 | European Pat. Off. . |

*Primary Examiner*—David Nelms
*Assistant Examiner*—Andrew Q. Tran
*Attorney, Agent, or Firm*—Oliff & Berridge, PLC

[57] ABSTRACT

It is an object of the present invention to provide a semiconductor memory apparatus that provides a large determination margin for reading operation. A semiconductor memory apparatus includes a memory cell array having a common source line disposed between first memory cells and second memory cells, a comparison cell pair (first and second comparison cells) and a read circuit. The comparison cells are formed by the same manufacturing process as that of the memory cells. The read circuit includes a comparison cell selection circuit for selecting one of the comparison cells. When a memory cell is read, the comparison cell selection circuit selects one of the comparison cells that corresponds to the memory cell. A plurality of comparison cell pairs may be provided and comparison cells thereof may be connected in parallel with one another. In this case, the size of each transistor of a current mirror circuit included in a sense amplifier is adjusted in accordance with the number of the comparison cell pairs. The semiconductor memory apparatus is applicable to memories whose source and drain regions are formed by diagonal ion implantation.

11 Claims, 11 Drawing Sheets

ERASED STATE

ERASED STATE

WRITTEN STATE

WRITTEN STATE

SEMICONDUCTOR MEMORY APPARATUS

BACKGROUND OF THE INVENTION

1. Field of the Invention

The present invention relates to a semiconductor memory apparatus having a first cell group of memory cells of a specified row in a memory cell array, a second cell group of memory cells of either a row immediately before the specified row or a row immediately after the specified row and a common source line disposed therebetween. More particularly, the present invention relates to a semiconductor memory apparatus in which even when the effective channel length of the memory cells on one side of the common source and that on the other side of the common source are different from one another, a large determination margin can be provided for the memory cells on both sides.

2. Description of the Prior Art

For example, U.S. Pat. No. 5,386,158 describes a conventionally known technique that uses comparison cells for determining whether a value stored in a flash EEPROM (hereinafter flash memory) is "0" or "1". This technique, which is the background technique, will be described with reference to FIG. 9.

As shown in FIG. 9, a memory cell array 1 is formed from split gate type memory cells. In the memory cell array 1, a first cell group of memory cells (only memory cells 11 and 13 shown in this example) of a specified row (an odd-number row $R_{2m-1}$ in this example) and a second cell group of memory cells (only memory cells 12 and 14 shown in the example) of a row immediately before or a row immediately after the specified row (an even-numbered row $R_{2m}$ to in this example) are disposed to form a pair for the two rows. Source regions S1–S4 of the respective memory cells are connected to a common memory cell source line 3. Each two of the memory cells (in this example, 11 and 12, and 13 and 14) for each column (column $C_n$ or $C_{n+1}$ in this example) form a memory cell pair in which the source line 3 is disposed (symmetrically, in this example) therebetween. In FIG. 9, m=1, 2, . . . , M/2 (where M is the number of rows), and n=1, 2, . . . , N (where N is the number of columns of the memory cell array).

A word line $WL_{2m-1}$ is connected to control gates CG1 and CG3 of the respective memory cells 11 and 13 of the row $R_{2m-1}$, and a word line $WL_{2m}$ is connected to control gates CG2 and CG4 of the respective memory cells 12 and 14 of the row $R_{2m}$. A Bit line $BL_n$ is connected to drain regions D1 and D2 of the respective memory cells 11 and 12 that belong to the column $C_n$, and a Bit line $BL_{n+1}$ is connected to drain regions D3 and D4 of the respective memory cells 13 and 14 that belong to the column $C_{n+1}$.

In FIG. 9, a read circuit 7 includes a comparator unit 71, a comparison cell 72, and sense amplifiers 731 and 732. A source region S of the comparison cell 72 is connected to a comparison cell source line 81. Although not shown, the source line 81 and the source line 3 of the memory cell array 1 described above have the same potential, and the comparison cell 72 and the memory cells 11 and 13 are oriented in the same direction.

A comparison signal REF (drain current $Id_r$) from the comparison cell 72 is inputted in the sense amplifier 731. A read signal WS (drain current $Id_w$) from the memory cell is inputted in the sense amplifier 732. The amplification factor of the sense amplifier 732 is set to be smaller than the amplification factor of the sense amplifier 731. The comparator unit 71 compares an output REF' (drain current $Id_r'$) of the sense amplifier 731 and an output WS' (drain current $Id_w'$) of the sense amplifier 732 to thereby determine as to whether a stored value of the memory cell to be read out is "0" or "1" (in other words, in a written state or an erased state).

In FIG. 9, when physical addresses $A_0, A_1, \ldots A_k$, of the memory cell array 1 are designated, a row address decoder 41 decodes lower bits $A_0, A_1, \ldots A_j$, a column address decoder 42 decodes upper bits $A_{j+1}, A_{j+2}, \ldots A_k$, a multiplexer 43 transmits a read signal WS (drain current $Id_w$) coming from the memory cell to the sense amplifier 732 based on a signal from the column address decoder 42.

It is noted that the memory cells forming the memory cell array 1 and the comparison cell 72 provided in the read circuit 7 include components that are normally, simultaneously formed on the same substrate with the same manufacturing process. As a result, for example, a mask alignment for forming floating gates 111 and 121 may deviate from a mask alignment for forming control gates 112 and 122 for the respective memory cells 11 and 12 (in FIG. 10, designed locations of the floating gates are indicated by α1 and α2, respectively).

A common source region 103 and drain regions 114 and 124 of the respective memory cells 11 and 12 are formed after the floating gates 111 and 121 and the control gates 112 and 122 are formed. In other words, dopants for forming the source region and the drain regions are implanted from above the floating gates and the control gates. As a result, if a mask alignment error, such as the one described above, occurs, the effective channel length of the memory cell 11 and that of the memory cell 12 may be different from one another. For example, when the effective channel length L1 of the memory cell 11 is longer than the original channel length L0 by δ, the effective channel length L2 of the memory cell 12 is shorter than the original channel length L0 by δ. In other words, L1=L0+δ, and L2=L0−δ. Therefore, the difference in the effective channel length between the memory cells 11 and 12 is 2 δ.

On the other hand, although not shown in FIG. 10, the comparison cell 72 shown in FIG. 9 is normally formed to be oriented in the same direction of one of the memory cells 11 and 12. As a result, the effective channel length of the comparison cell 72 is different from the effective channel length of one of the memory cells 11 and 12. For example, if the comparison cell 72 and the memory cell 11 are oriented in the same direction, the effective channel length of the memory cell 11 and the comparison cell 72 is defined by L1=L0+δ. Therefore, the effective channel length of the memory cell 12 is defined by L2=L0−δ. Accordingly, the difference in the effective channel length between the memory cell 11 or the comparison cell 72 and the memory cell 12 is 2 δ.

As a result, although the memory cell 11 and the comparison cell 72 have the same Vcg/Id (Vcg: control gate voltage, and Id: drain current) characteristic, those of the memory cell 12 and the comparison cell 72 are substantially different from each other. This tendency becomes substantially noticeable in the erased state (in which electrons are not stored in the floating gate) (which will be described later with reference to FIG. 4B and FIG. 5B).

For example, FIGS. 11A and 11B are graphs illustrating drain currents Id in memory cells in odd-numbered rows and even-numbered rows when the memory cells in the erased state and in the written state (in which electrons are stored in the floating gate) are read. FIG. 11A shows drain currents in the erased state, and FIG. 11B shows drain currents in the written state. As shown in FIGS. 11A and 11B, the drain currents Id in the odd-numbered rows and in the even-numbered rows are different in magnitude regardless of whether the memory cells to be read are in the erased state or in the written state, and the differences become particularly noticeable in the erased state.

Also, if a mask alignment error such as the one shown in FIG. 10 occurs, the capacity ratio of the memory cell 11 (and also that of the comparison cell) differs from the capacity ratio of the memory cell 12. The term "capacity ratio" is defined by a ratio of the capacity between the control gate and the floating gate and the capacity between the floating gate and the source region. The capacity ratio determines a potential of the floating gate when the control gate is charged with a potential. Therefore, when the capacity ratios are different, the characteristics such as threshold values of the memory cells differ from one another.

Therefore, when the characteristics of the memory cells substantially differ from one another, the number of defective memory cells in which reading cannot be normally performed increases, or there is a greater possibility that defective flash memories are manufactured, lowering the manufacturing yield. As a consequence, a greater accuracy in the mask alignment is required in the manufacturing process. Also, determination margins in determining read signal values substantially vary from one another. As a consequence, for example, when the service life of products is considered based on deterioration of the endurance of flash-memories, product catalogs must recite the service life of a flash memory that has the largest effective channel length difference 2 δ. As a result, the service life of those flash-memories that are still usable is immaturely terminated substantially earlier than it should be. Therefore, for example, even when a flash memory is still usable, the user determines, by referring to the number of accesses, that the flash memory has reached the product life, and may unnecessarily replace the flash memory.

Also, since there are great variations in the determination margins, there is a certain limitation to implementing multiple memory level values (for example, increasing the memory level from two values to four values, eight values, and the like) in each memory cell. In addition, in the conventional flash-memories, the effective channel length difference 2 δ does not change regardless of the size of the memory cells. Therefore, the smaller the size of memory cells (in other words, the smaller the designed value of the channel length), the greater the ratio between the longer effective channel length (L0+δ) and the shorter effective channel length (L0−δ). This prevents higher integration of flash memories.

SUMMARY OF THE INVENTION

The present invention has been made to solve the problems described above, and objects of the present invention to be achieved are as follows.

(1) In a semiconductor memory apparatus having a memory cell array that includes a first cell group of memory cells of a specified row, a second cell group of memory cells of one of a row immediately before the specified row and a row immediately after the specified row, and a common source line for both of the cell groups disposed therebetween, a read circuit can take a large determination margin for the memory cells provided on both sides even when the effective channel length of the memory cells on one side of the source line and that on the other side of the source line are different from one another.

(2) Each of the memory cells forming the semiconductor memory apparatus has multiple memory state values.

(3) When the semiconductor memory apparatus is manufactured, the production yield is improved, and the service life of the semiconductor memory apparatus is practically prolonged.

(4) When the semiconductor memory apparatus is manufactured, some mask alignment errors are permitted.

(5) Higher integration of the semiconductor memory apparatus is promoted.

To achieve the above-described objects, a semiconductor memory apparatus in accordance with the present invention has a memory cell array that includes a first cell group of memory cells of a specified row, a second cell group of memory cells of one of a row immediately before the specified row and a row immediately after the specified row, and a common memory cell source line for both of the cell groups disposed therebetween. Source regions of the memory cells of the first and second cell groups are connected to the memory cell source line. Also, the memory cells in the first cell group and the memory cells in the second cell group for a specified column form memory cell pairs.

The above-described semiconductor memory apparatus includes at least one comparison cell pair. The comparison cell pair is formed from first and second comparison cells and a comparison cell source line disposed between the first and second comparison cells. One of the first and second comparison cells is oriented in the same direction of the memory cells in the first cell group, and the other of the first and second comparison cells is oriented in the same direction of the memory cells in the second cell group, and source regions of the first and second comparison cells are respectively connected to the comparison cell source line.

Each of the memory cells forming the memory cell arrays and the first and second comparison cells forming the comparison cell pair normally have the same configuration. A plurality of the comparison cell pairs for read-out purpose may be provided in one memory cell array in order to secure dummy comparison cell pairs (in which the comparison cell pairs that are used are disposed between a plurality of dummy comparison cell pairs that are not normally used). Also, a plurality of the comparison cells may be connected in parallel with one another in order to level off variations in the characteristic of the comparison cells.

In accordance with the present invention, each of the memory cells, the first comparison cell and the second comparison cell has, for example, a split-gate type structure, and is formed from components that are formed by the same manufacturing process on a common substrate, and normally at the same time. The split-gate type memory cell includes a substrate having a channel region and source and drain regions provided on both sides of the channel region, a floating gate formed over the substrate with an insulation layer disposed therebetween, and a control gate formed over the floating gate with an insulation layer disposed therebetween. The floating gate is formed in a fashion that the floating gate covers a part of the channel region.

The read circuit includes a comparison cell selection circuit that selects one of the first and second comparison cells that form the comparison cell pair. When a memory cell is read, the comparison cell selection circuit selects one of the comparison cells that is oriented in the same direction of the memory cell to be read. In particular, in accordance with the present invention, the comparison cell selection circuit detects only the least significant bit (LSB) of the physical address of the memory cell to be read out.

If the mask alignment for forming the floating gates of the memory cells deviates from the mask alignment for forming the control gates during manufacturing the semiconductor memory apparatus in accordance of the present invention, the effective channel length of the memory cells located on one side of the memory cell source line may differ from the effective channel length of the memory cells located on the other side of the memory cell source line. Depending upon the structure of memory cells, not only the channel length but also the channel width may be affected by the mask alignment error. For example, when the mask alignment error occurs in the same direction of the flow of current in the channel region, the effective channel length varies from one memory cell to another. On the other hand, the mask alignment error occurs in a direction transverse to the flow of current, the effective channel width varies from one memory cell to another.

In accordance with the present invention, when a floating gate of each of the memory cells is formed, a floating gate of each of the comparison cells is also preferably formed at the same time. Also, when a control gate of each of the memory cells is formed, a control gate of each of the comparison cells is preferably formed at the same time. Also, in accordance with the present invention as described above, the memory cells disposed on one side of the memory source line and the comparison cells disposed on one side of the comparison cell source line are oriented in the same direction, and the memory cells disposed on the other side of the memory cell source line and the comparison cells disposed on the other side of the comparison cell source line are oriented in the same direction.

As a result, the effective channel length of the memory cells located on one side of the memory source line and the effective channel length of the comparison cells located on one side of the comparison cell source line become equal or substantially equal to one another. Also, the effective channel length of the memory cells located on the other side of the memory cell source line and the effective channel length of the comparison cells located on the other side of the comparison cell source line become equal or substantially equal to one another. The memory cells and the comparison cells having the same effective channel length are expected to have the same Vcg/Id (Vcg: control gate voltage, and Id: drain current) characteristic.

In accordance with the present invention, when a memory cell is read, the comparison cell selection circuit selects a comparison cell having an effective channel length which is the same or substantially the same as that of the memory cell to be read. In other words, a read signal is determined with the comparison cell having the same Vcg/Id characteristic as that of the memory cell to be read. As a result, the problems of prior art caused by the difference in the effective channel length between the memory cell and the comparison cell are solved.

When a plurality of comparison cell pairs are provided in accordance with the present invention, drain regions of the first comparison cells included in the plurality of the comparison cell pairs are preferably connected together, and drain regions of the second comparison cells included in the plurality of the comparison cell pairs are also preferably connected together. By providing a plurality of comparison cell pairs and connecting the plurality of the comparison cells in parallel with one another, variations in the characteristic of the comparison cells are averaged. For example, let us consider a case when first and second comparison cell pairs are provided and a first comparison cell in the first comparison cell pair and a first comparison cell in the second comparison cell pair are selected. In this case, in accordance with the present invention, there is generated a comparison current having a value corresponding to an average value of a drain current of the first comparison cell in the first comparison cell pair and a drain current of the first comparison cell in the second comparison cell pair. In a similar manner, when a second comparison cell in the first comparison cell pair and a second comparison cell in the second comparison cell pair are selected, there is generated a comparison current having a value corresponding to an average value of a drain current of the second comparison cell in the first comparison cell pair and a drain current of the second comparison cell in the second comparison cell pair. As a result, if drain currents of comparison cells varies due to, for example, process variations, variations in comparison currents can be restricted to the minimum.

In this case, the read circuit in accordance with the present invention preferably includes a first sense amplifier that converts a first current flowing in the memory cell to be read out to a second current, a second sense amplifier that converts a third current flowing in the comparison cell pair to a fourth current, and a comparator section that compares the second current from the first sense amplifier and the fourth current from the second sense amplifier. Further, at least one of a first current ratio between the first current and the second current and a second current ratio between the third current and the fourth current is adjusted to a value corresponding to the number of the comparison cell pairs. In this case, with an increase in the number of the comparison cell pairs, for example, the second current ratio may be decreased, or the first current ratio may be increased. As a result, when the number of the comparison cell pairs increases, the comparison current (for example, the fourth current of the second sense amplifier) is optimized.

In this case, in accordance with the present invention, the first sense amplifier preferably includes a first current mirror circuit, and the second sense amplifier preferably includes a second current mirror circuit. Further, each of transistors forming the first current mirror circuit and the second current mirror circuit has a size that is adjusted according to the number of the comparison cell pairs. As a result, the first current ratio and the second current ratio are adjusted to optimum values corresponding to the number of comparator cell pairs only by adjusting the size of the transistor.

The present invention is particularly effective when the memory cell and the comparison cell are split-gate type EEPROM, EPROM, and the like). However, the present invention is also applicable to memory cells and comparison cells of types other than the split-gate type, such as, for example, mask ROMS, DRAMS, SRAMs and the like. In particular, the present invention is effective when the memory cells and the first and second comparison cells are the type in which source regions and drain regions thereof are formed by impurities that are diagonally implanted.

DETAILED DESCRIPTION OF THE PREFERRED EMBODIMENTS

1. Structure

Figure 1:
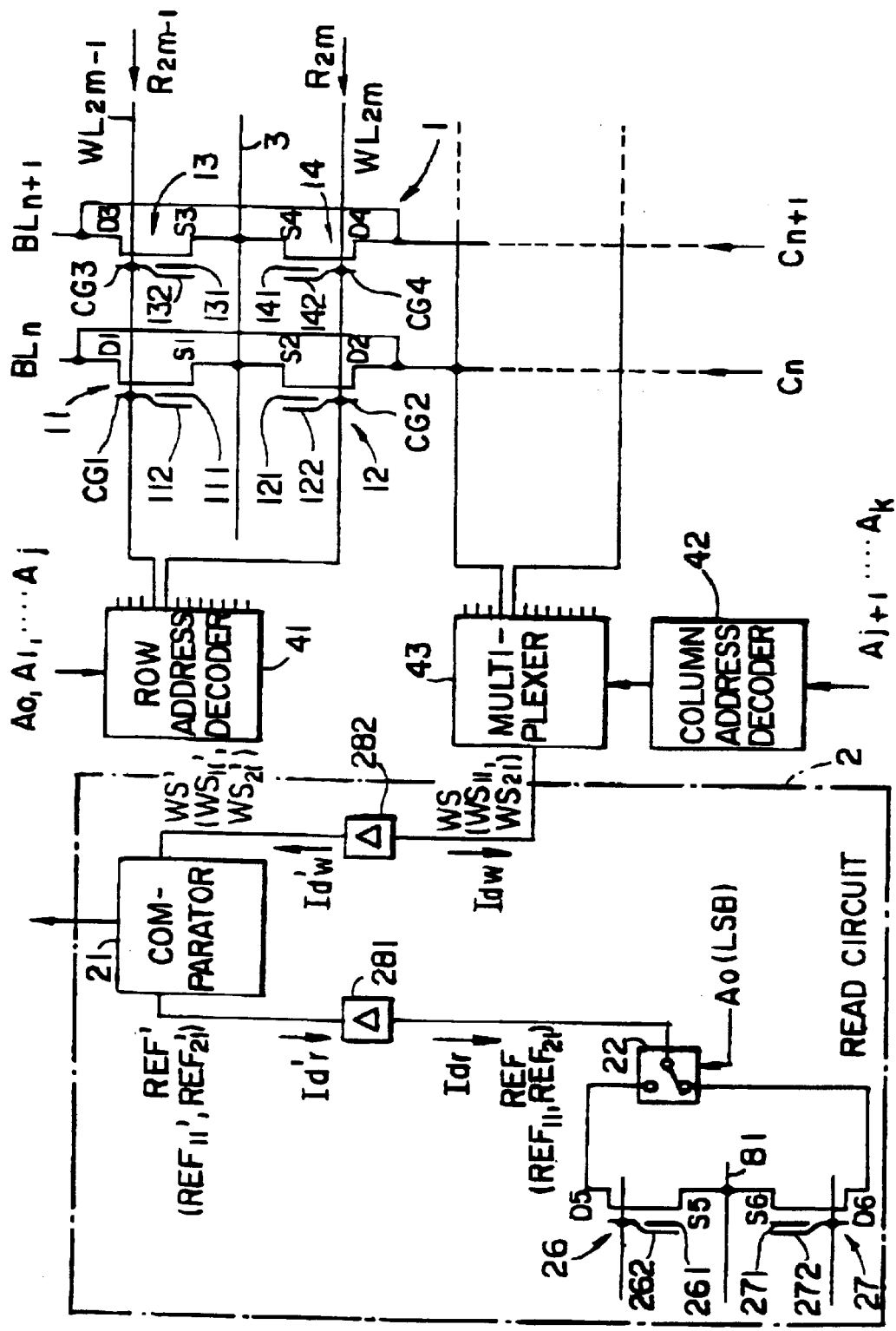
FIG. 1 is a view of a semiconductor memory apparatus in part in the form of a flash memory in accordance with one embodiment of the present invention.

FIG. 1 shows a partial view of a flash memory, that is an example of a semiconductor memory apparatus in accordance with an embodiment of the present invention. A memory cell array 1 shown in FIG. 1 has the same structure as that of the memory cell array described above with reference to FIG. 9. Therefore, the description thereof is omitted. Also, the operations of a row address decoder 41, a column address decoder 42 and a multiplexer 43 are the same as those of the flash memory shown in FIG. 9, and therefore the description thereof is also omitted.

A read circuit 2 shown in FIG. 1 includes a comparison cell selection circuit 22, a comparison cell pair of two comparison cells 26 and 27 (first and second comparison cells), and sense amplifiers 281 and 282. The comparison cells 26 is oriented in the same direction of the memory cells 11 and 13, and the comparison cell 27 is oriented in the same direction of the memory cells 12 and 14. In addition, a common source line 81 is disposed between the comparison cells 26 and 27. The comparison cells of the comparison cell pair are disposed opposing to one another, and source regions S5 and S8 of each of the comparison cells 26 and 27 are connected to the source line 81. Also, although not shown in the figure, the source line 81 and the source line 3 of the above-described memory cell array 1 are connected in a manner to have the same potential.

In accordance with the present embodiment, the memory cells forming the memory cell pair are symmetrically disposed pith respect to the source line 3, and the comparison cells 26 and 27 are symmetrically disposed with respect to the source line 81. However, the present invention is not limited to this embodiment configuration. Also, relative positions of the memory cells forming the memory cell pairs and relative positions of the comparison cells 27 and 27 are not limited to the relative positions of the cells of the present embodiment, and depending upon deviation in mask alignment and orientation of the channels, any other relative positions may be applicable as long as the effects of the present invention are achieved.

A comparison signal $REF_{11}$ or a comparison signal $REF_{21}$ (drain current Idr) from the comparison cell 26 or the comparison cell 27 that is selected by the comparison cell selection circuit 22 is input through the sense amplifier 281 in the comparator section 21 as $REF_{11}'$ or $REF_{21}'$ (drain current Idr'). In this embodiment, the comparison signal $REF_{11}$ and the comparison signal $REF_{21}$ are provided from the comparison cell 26 and the comparison cell 27, respectively. Read signal $WS_{11}$ or read signal $WS_{21}$ (drain current Idw) from memory cells is input through the sense amplifier 282 in the comparator section 21 as $WS_{11}'$ or $WS_{21}'$ (drain current Idw). It is noted that, in this embodiment, the read signal $WS_{11}$ and the read signal $WS_{21}$ are a read signal from a memory cell in an odd row and a read signal from a memory cell in an even row, respectively. The amplification factor of the sense amplifier 282 is set at a value smaller than that of the amplification factor of the sense amplifier 281. The comparator section 21 compares the signal ($REF_{11}'$ or $REF_{21}'$) received from the sense amplifier 281 and the signal ($WS_{11}'$ or $WS_{21}'$) received from the sense amplifier 282, and determines whether a value stored in the memory cell is either "0" or "1" (in other words, whether or not electrons are stored in the floating gate).

In accordance with the present embodiment, components in each of the memory cells forming the memory cell array 1 and the comparison cells 26 and 27 are formed at the same time on a common substrate by the same manufacturing process. When the memory cells and the comparison cells of the flash memory shown in FIG. 1 are formed, a mask alignment error may occur between the mask alignment for forming floating gates (111, 121, 131, 141, 261 and 271 shown in FIG. 1) and the mask alignment for forming control gates (112, 122, 132, 142, 262 and 272 shown in FIG. 11), in a similar manner as the flash memory shown in FIGS. 9 and 10. If such a mask alignment error occurs, the effective channel length and the capacitor ratio differ from one another between, for example, the memory cells 11, 13 and the memory cells 12, 14. Also, the effective channel length and the capacitor ratio differ from one another between the comparison cell 26 and the comparison cell 27.

Figure 2:
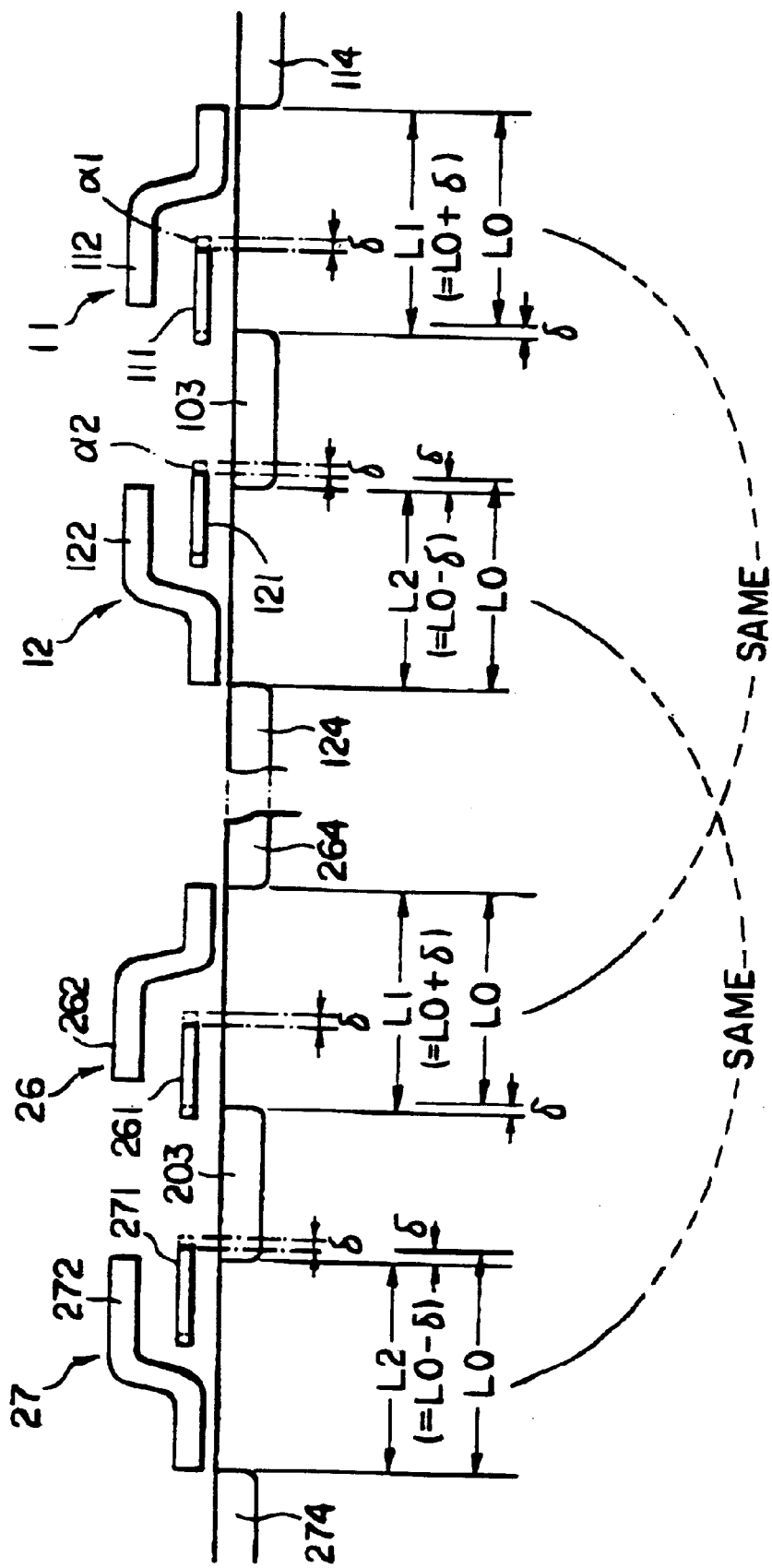
FIG. 2 is an explanatory side view of a memory cell pair and a comparison cell pair shown in FIG. 1.
Figure 3:
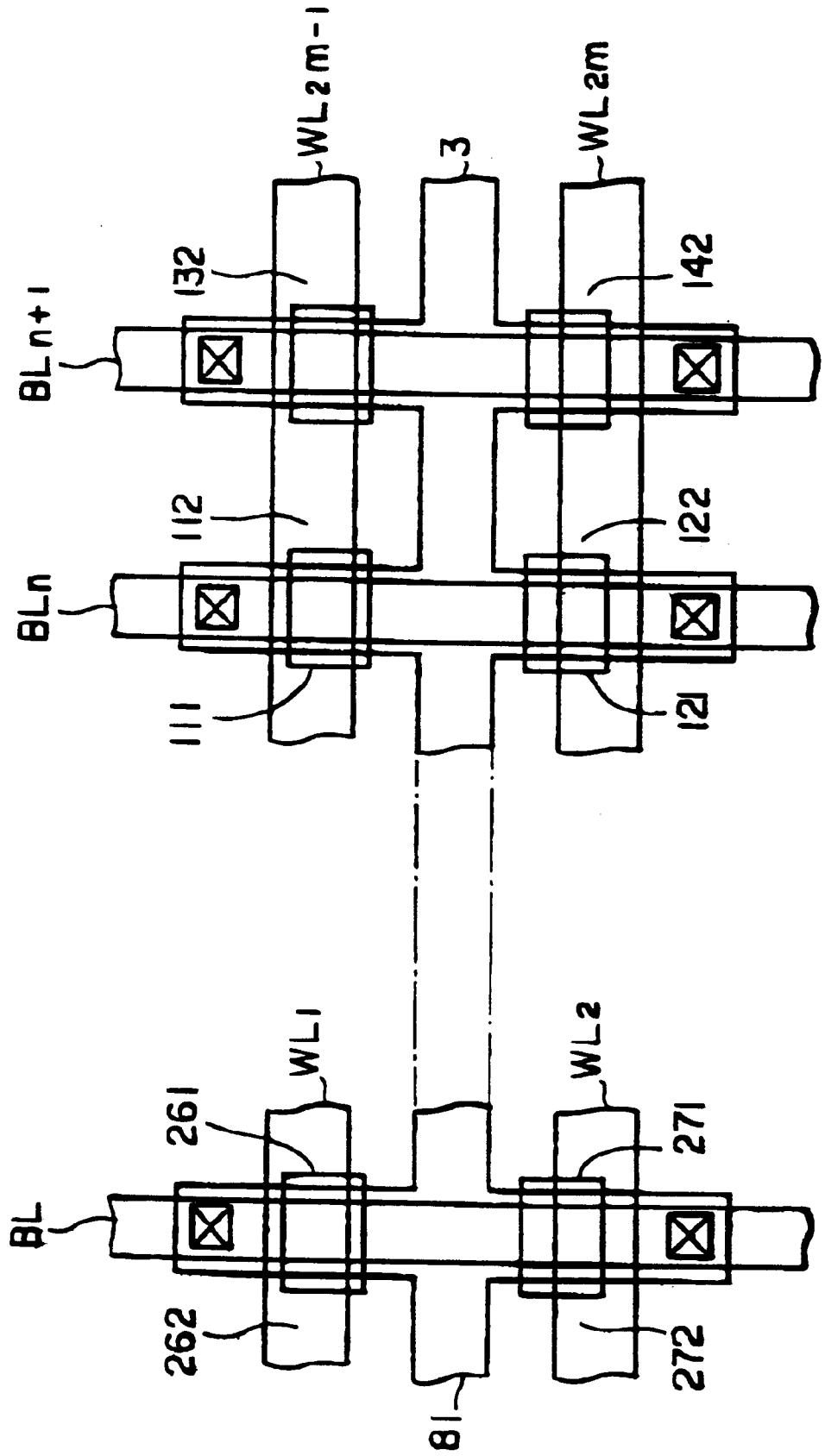
FIG. 3 is an explanatory plan view of the memory cell pair and the comparison cell pair shown in FIG. 1.

However, in accordance with the present embodiment, as shown in the explanatory side view of FIG. 2 and the explanatory plan view of FIG. 3, the comparison cell 26 and the memory cell 11 are disposed in the same orientation, and the comparison cell 27 and the memory cell 12 are disposed in the same orientation. As a result, the comparison cell 26 and the memory cell 11 have the same effective channel length and the comparison cell 27 and the memory cell 12 have the same effective channel length (the capacitor ratio thereof is also the same).

FIGS. 2 and 3 show a case in which the effective channel length of the memory cell 11 and the comparison cell 26 is longer, and the effective channel length of the memory cell 12 and the comparison cell 27 is shorter. Also, as shown in FIG. 2, the comparator cells 26 and 27 include floating gates 261 and 271, control gates 262 and 272, drain regions 264 and 274, respectively, and a common source region 203. It is noted that the same components are designated by the same reference numerals in FIGS. 1, 2 and 10. FIG. 3 shows bit lines BL and word lines $WL_1$ and $WL_2$. The same components are designated by the same reference numerals in FIGS. 1 and 3.

2. Operation

The flash memory shown in FIG. 1 operates in a manner described below. The comparison cell selection circuit 22 selects the comparison cell 26 that is oriented in the same direction as the memory cell 11 when the memory cell 11 is read. On the other hand, when the memory cell 12 is read, the comparison cell selection circuit 22 selects the comparison cell 27 that is oriented in the same direction of the memory cell 12. In the present embodiment, the comparison cell selection circuit 22 detects LSB (least significant bit) of a physical address of a memory cell to be read, and selects a comparison cell based on whether the LSB is "0" or "1". In accordance with the present embodiment, physical addresses of the memory cell array are arranged so that odd rows are represented by LSB being "0", and even rows are represented by LSB being "1".

3. Improvements in Determination Margin

Figure 4A:
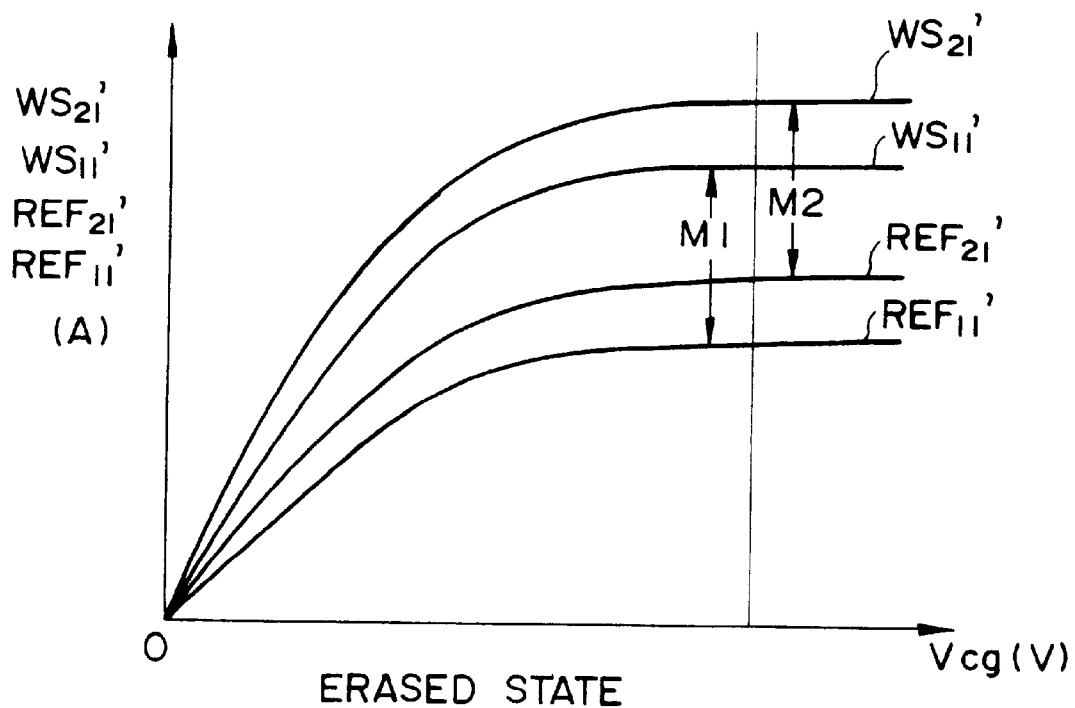
FIG. 4A is a graph showing the relation between comparison signals and read-out signals when electrons are not stored in a floating gate of a memory cell (in an erased state) in accordance with an embodiment of the present invention.

FIG. 4A is a graph showing characteristics of signals $REF_{11}'$ and $REF_{21}'$ from the sense amplifier 281 and characteristics of signals $WS_{11}'$ and $WS_{21}'$ from the sense amplifier 282 in accordance with the present invention when a memory cell is in the erased state (i.e., when electrons are not stored in the floating gate of the memory cell to be read). The abscissa of the graph in FIG. 4A represents voltage Vcg applied to each control gate and the ordinate represents current. A margin M1 is obtained when a memory cell in the first cell group (for example, the memory cell 11) is read with the use of the comparison cell 26, and a margin M2 is obtained when a memory cell in the second cell group (for example, the memory cell 12) is read with the use of the comparison cell 27.

Figure 4B:
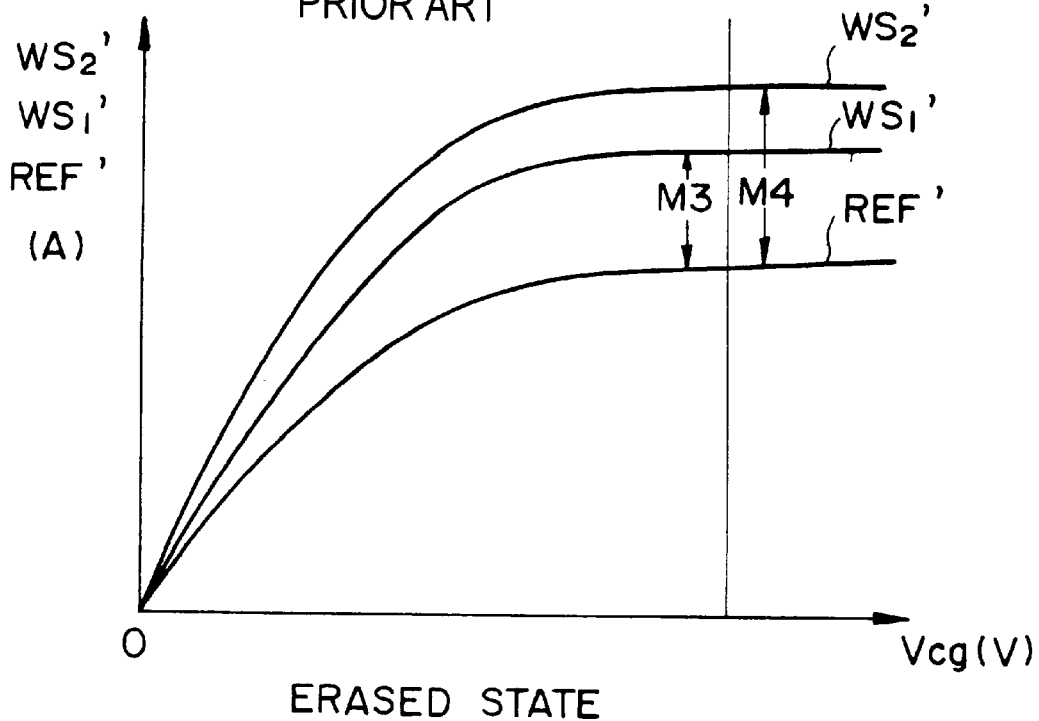
FIG. 4B is a graph showing the relation between comparison signals and read-out signals in a flash memory in the erased state shown in FIG. 9.
Figure 9:
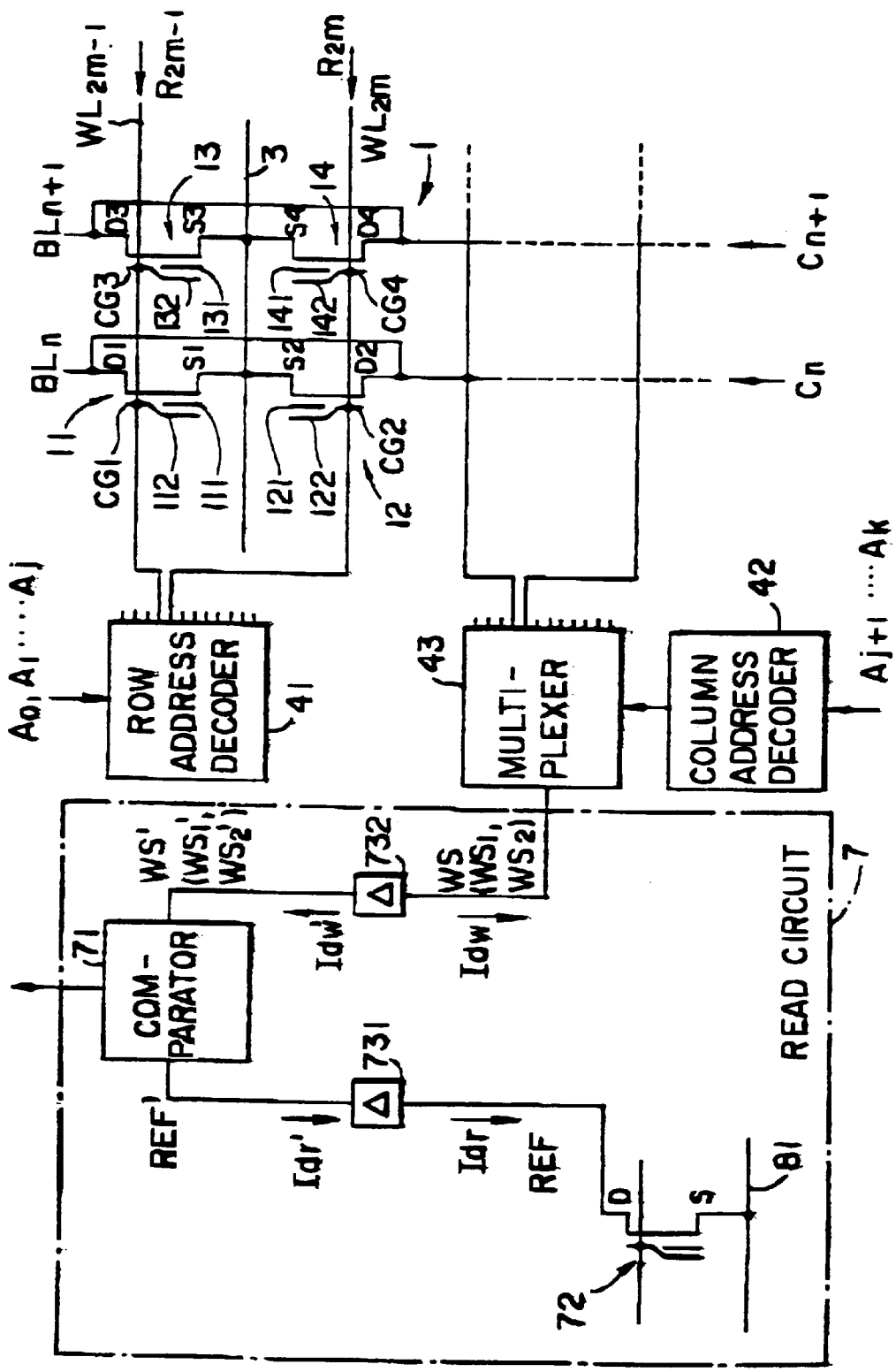
FIG. 9 is an explanatory view for describing the background technology of flash-memories.
Figure 10:
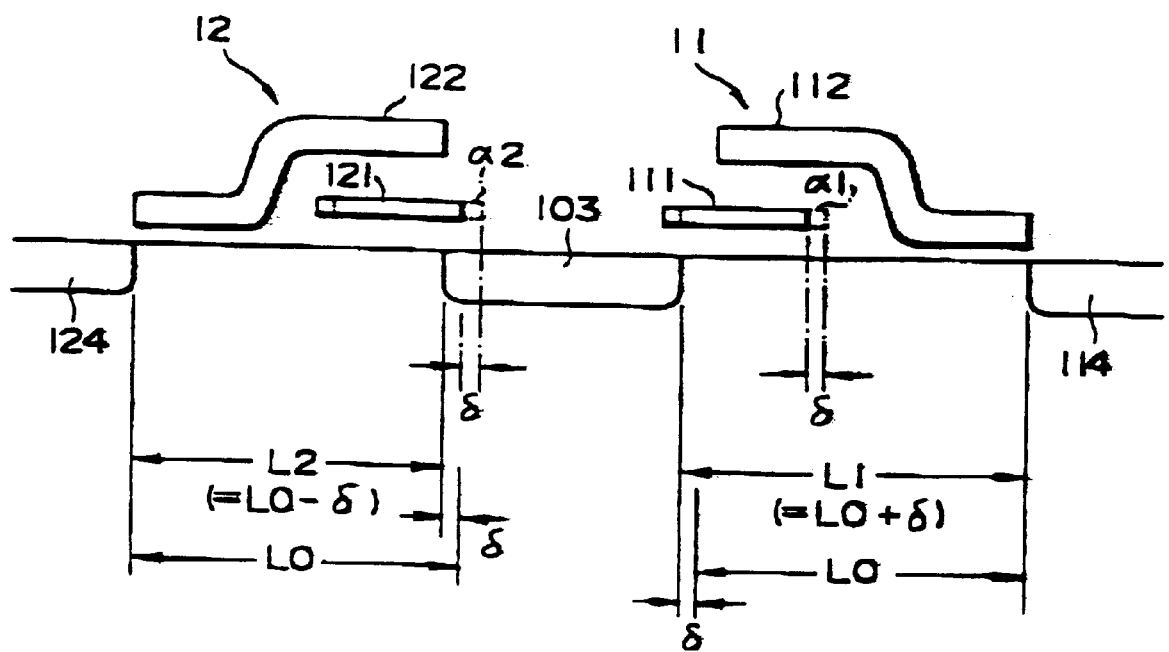
FIG. 10 is a side view of a memory cell pair shown in FIG. 9.
Figure 11B:
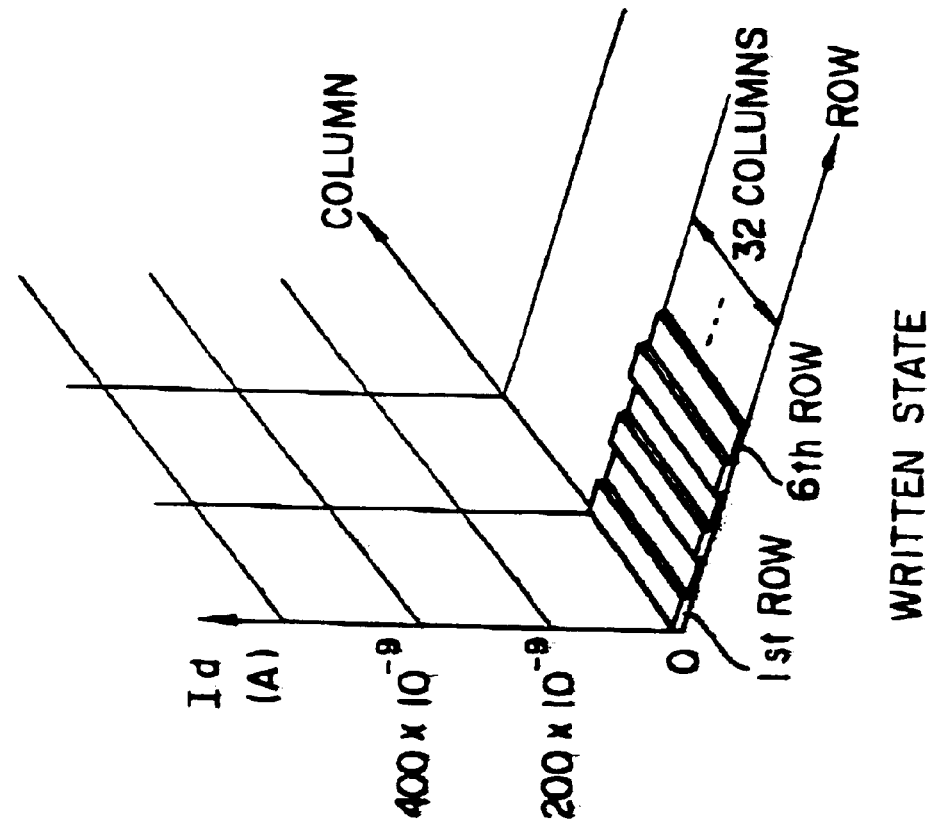
FIG. 11B is a graph showing the magnitude of drain currents Id flowing in memory cells in odd rows and even rows in the memory cell array when the memory cells in a written state are read.
Figure 11A:
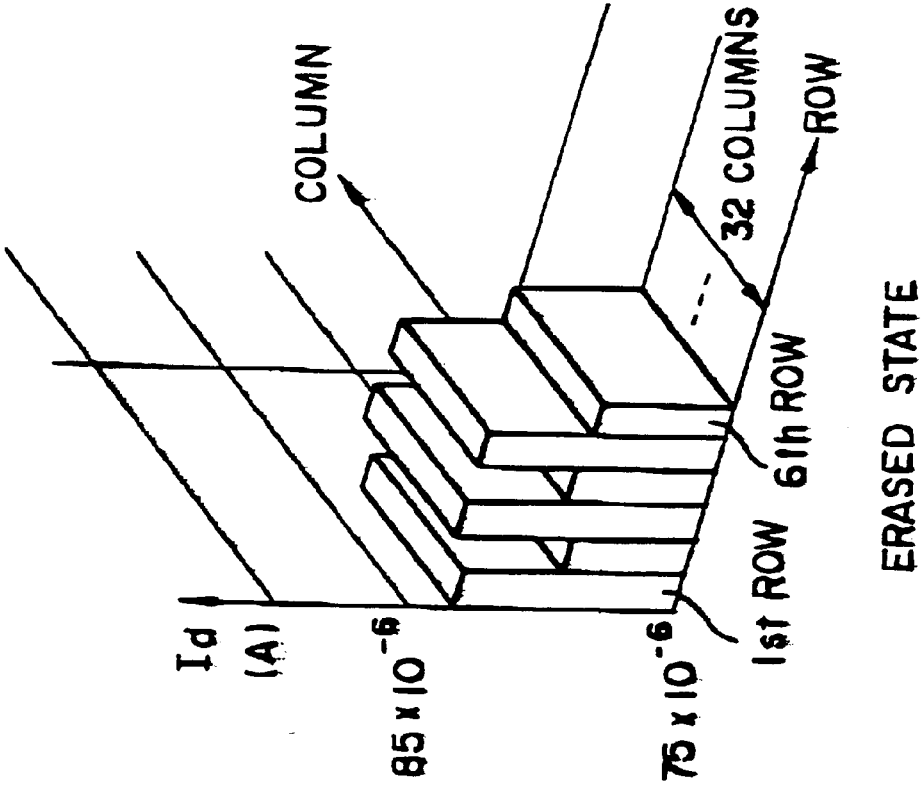
FIG. 11A is a graph showing the magnitude of drain currents Id flowing in memory cells in odd rows and even rows in a normal memory cell array when the memory cells in an erased state are read.

FIG. 4B is a graph showing characteristic of signal REF' from the sense amplifier 731 and characteristics of signals $WS_1'$ and $WS_2'$ from the sense amplifier 732 of the flash memory shown in FIGS. 9 and 10 when a memory cell is in the erased state. The abscissa of the graph in FIG. 4B also represents voltage Vcg applied to each control gate and the ordinate represents current. A margin M3 is obtained when a memory cell in the first cell group (for example, the memory cell 11) is read with the use of the comparison cell 72, and a margin M4 is obtained when a memory cell in the second cell group (for example, the memory cell 12) is read with the use of the comparison cell 72.

Figure 5A:
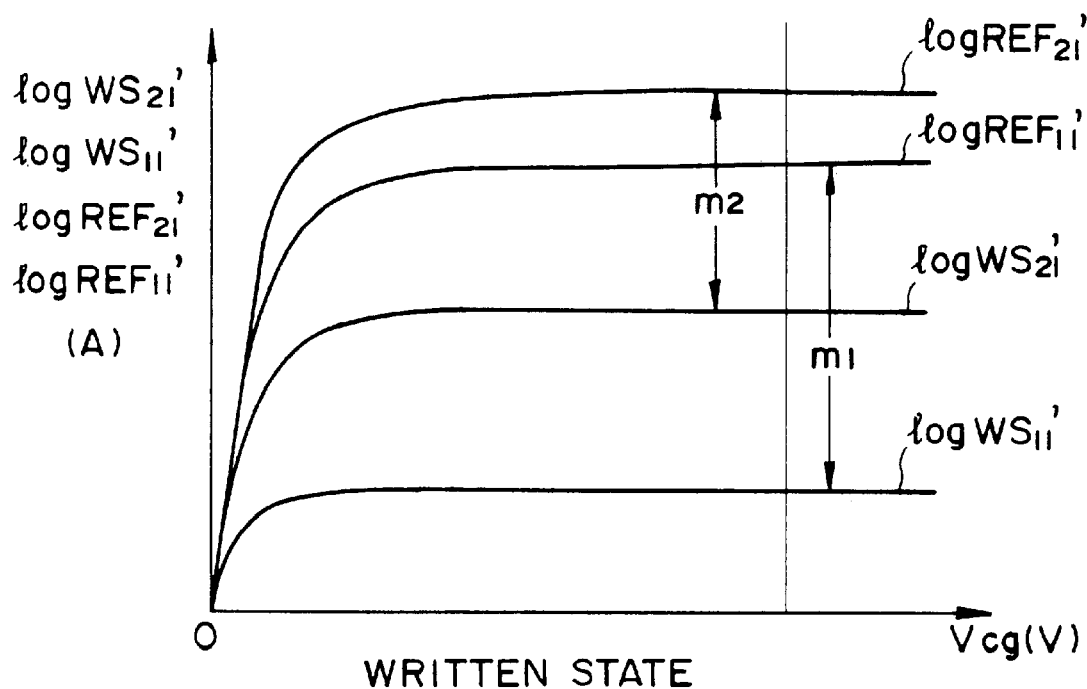
FIG. 5A is a graph showing the relation between comparison signals and read-out signals when electrons are stored in a floating gate of a memory cell (in a written state) in accordance with an embodiment of the present invention.

FIG. 5A is a graph showing characteristics of signals $REF_{11}'$, $REF_{21}'$, $WS_{11}'$ and $WS_{21}'$ in accordance with the present invention when a memory cell is in the written state (i.e., when electrons are stored in the floating gate of the memory cell). The abscissa of the graph in FIG. 5A represents voltage Vcg applied to each control gate and the ordinate represents current in logarithm. The current is represented in logarithm in FIG. 5 (A), because differences between $REF_{11}'$, $REF_{21}'$ and $WS_{11}'$, $WS_{21}'$ are substantially large ($WS_{11}'$ and $WS_{21}'$ are substantially small), unlike those shown in FIG. 4A. A margin m1 is obtained when a memory cell in the first cell group (for example, the memory cell 11) is read with the use of the comparison cell 26, and a margin m2 is obtained when a memory cell in the second cell group (for example, the memory cell 12) is read with the use of the comparison cell 27.

Figure 5B:
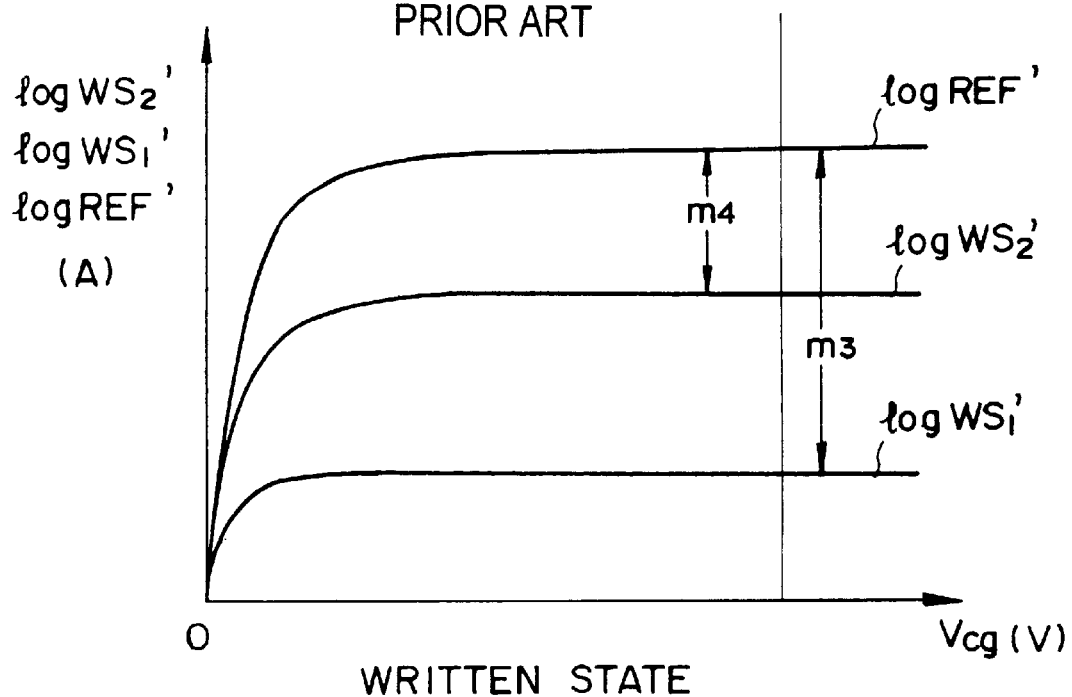
FIG. 5B is a graph showing the relation between comparison signals and read-out signals in a flash memory in the written state shown in FIG. 9.

FIG. 5B is a graph showing characteristics of signals REF', $WS_1'$ and $WS_2'$ of the flash memory shown in FIGS. 9 and 10 when a memory cell is in the written state. The abscissa of the graph in FIG. 5B also represents voltage Vcg applied to each control gate and the ordinate represents current in logarithm. A margin m3 is obtained when a memory cell in the first cell group (for example, the memory cell 11) is read with the use of the comparison cell 72, and a margin m4 is obtained when a memory cell in the second cell group (for example, the memory cell 12) is read with the use of the comparison cell 72.

The comparison cells in any of the cases shown in FIGS. 4A, 4B, 5A and 5B are in the erased state. Therefore, a current flowing in a memory cell and a current flowing in a comparison cell in the erased state are compared (in effect, these currents are converted by the sense amplifiers to other currents, and the converted currents are compared) to make a determination as to whether the memory cell is in the written state or in the erased state (i.e., a determination whether a value stored in the memory cell is "0" or "1"). Therefore, the signals $REF_{11}'$, $REF_{21}'$ and REF' shown in FIGS. 4A and 4B and the signals $REF_{11}'$, $REF_{21}'$ and REF' shown in FIGS. 5A and 5B present the same characteristics. (It is noted that FIGS. 5A and 5B show values in logarithm) For example, as shown in FIG. 4A, when the signal $WS_{11}'$ is greater than the signal $REF_{11}'$, a determination is made that the memory cell 11 is in the erased state. When the signal $WS_{21}'$ is greater than the signal $REF_{21}'$, a determination is made that the memory cell 12 is in the erased state. On the other hand, as shown in FIG. 5A, when the signal $WS_{11}'$ is smaller than the signal $REF_{11}'$, a determination is made that the memory cell 11 is in the written state. When the signal $WS_{21}'$ is smaller than the signal $REF_{21}'$, a determination is made that the memory cell 12 is in the written state.

As shown in FIG. 4A and FIG. 5A, in the flash memory in accordance with the present embodiment, a margin M1 for determining whether or not the memory cell 11 is in the erased state and a margin m1 for determining whether or not the memory cell 11 is in the written state are both large. Also, a margin M2 for determining whether or not the memory cell 12 is in the erased state and a margin m2 for determining whether or not the memory cell 12 is in the written sate are both large. This is because, in accordance with the present embodiment, when the signal $WS_{11}'$ becomes smaller and the signal $WS_{21}'$ becomes larger due to a mask alignment error or the like, the signal $REF_{11}'$ to be compared with the signal $WS_{11}'$ becomes smaller, and the signal $REF_{21}'$ to be compared with the signal $WS_{21}'$ becomes larger.

In contrast, in the flash memory shown in FIGS. 9 and 10, although a margin m3 for determining whether or not the memory cell 11 is in the written state is large, a margin M3 for determining whether or not the memory cell 11 is in the erased state is small. On the other hand, although a margin M4 for determining whether or not the memory cell 12 is in the erased state is large, a margin m4 for determining whether or not the memory cell 12 is in the written state is small. As a consequence, the smaller determination margin determines a representative determination margin of the memory cell, and therefore the production yield and service life of the flash memory deteriorate. The flash memory shown in FIGS. 9 and 10 has a single reference signal REF'. As a result, when the signal $WS_1'$ becomes smaller and the signal $WS_2'$ becomes larger due to a mask alignment error or the like, either the margin for determining the erased sate or the margin for determining the written state deteriorates with respect to both of the memory cells 11 and 12.

4. Parallel Connection of Comparison Cells

Figure 6:
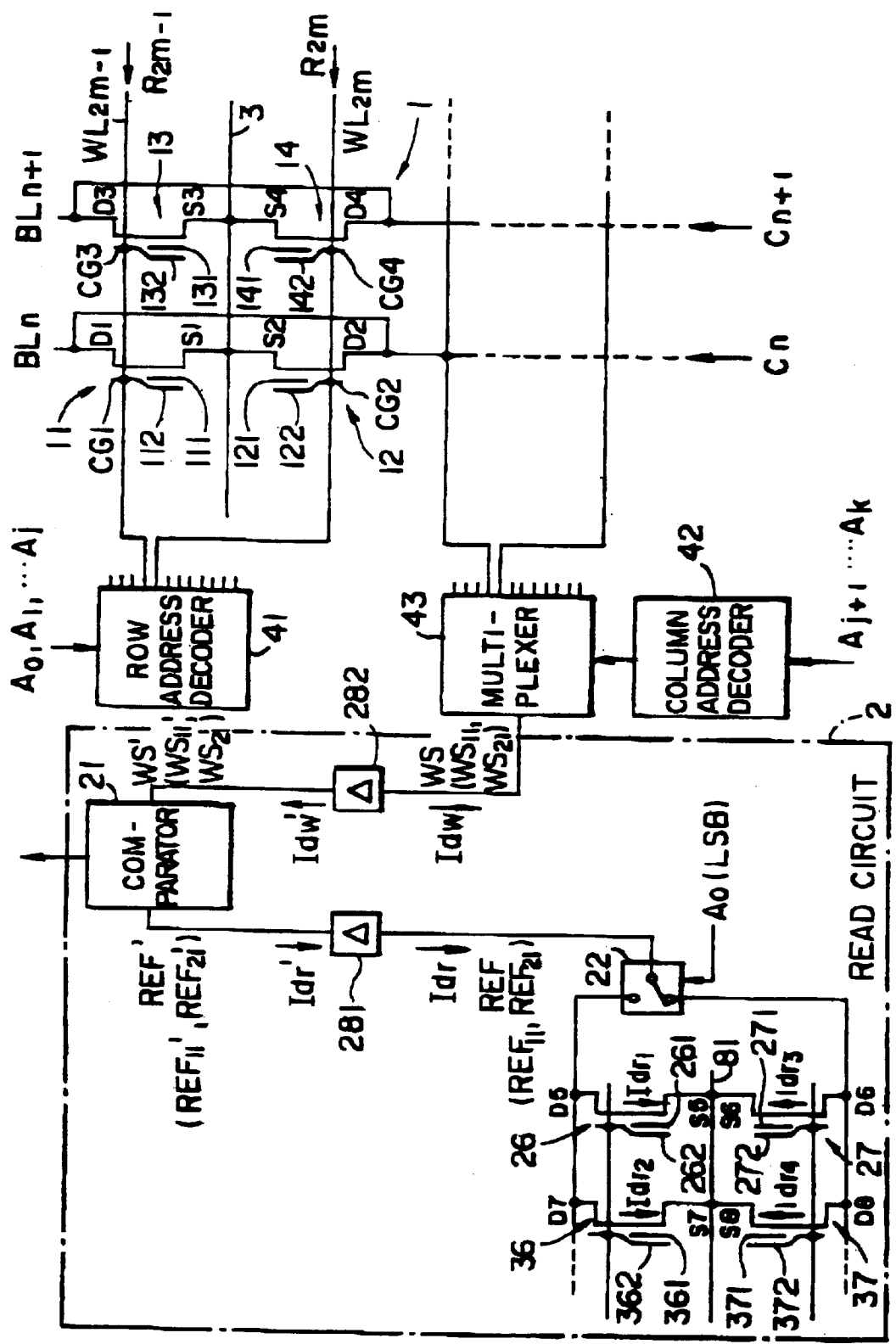
FIG. 6 is view of a flash memory in part having a plurality of comparison cell pairs in accordance with an embodiment of the present invention.

FIG. 6 shows a structure in accordance with another embodiment of the present invention. The structure shown in FIG. 6 is characterized in that a plurality of comparison cells are provided, and the comparison cells are connected in parallel with one another. Other features are the same as those of the structure shown in FIG. 1, and therefore the description thereof is omitted.

The read circuit 2 shown in FIG. 6 includes a comparison cell pair composed of comparison cells 26 and 27 and a comparison cell pair composed of comparison cells 36 and 37. The comparison cells 26 and 36 are oriented in the same direction as the memory cells 11 and 13, and comparison cells 27 and 37 are oriented in the same direction as the memory cells 12 and 14. Also, the comparison cells 26 and 27 are arranged with a common source line 81 being disposed therebetween, and the comparison cells 36 and 37 are arranged with the common source line 81 being disposed therebetween. The comparison cells defining each of the comparison cell pairs are arranged opposite to each other, and source regions S5, S6, S7 and S8 of the respective comparison cells 26, 27, 36 and 37 are connected to the source line 81. Drain regions D5 and D7 of the respective comparison cells 26 and 36 are connected to each other, and drain regions D6 and D8 of the respective comparison cells 27 and 37 are connected to each other. FIG. 6 also shows floating gates 361 and 371 and control gates 362 and 372.

The flash memory shown in FIG. 6 operates in a manner described below. For example, when the memory cell 11 is read, the comparison cell selection circuit 22 selects both of the comparison cells 26 and 36 that are oriented in the same direction of the memory cell 11. In this case, the sum of a drain current $Id_{r1}$ flowing in the comparison cell 26 and a drain current $Id_{r2}$ flowing in the comparison cell 36 is inputted in the sense amplifier 281 as a drain current $Id_r$.

On the other hand, when the memory cell 12 is read, the comparison cell selection circuit 22 selects both of the comparison cells 27 and 37 that are oriented in the same direction of the memory cell 12. In this case, the sum of a drain current $Id_{r3}$ flowing in the comparison cell 27 and a drain current $Id_{r4}$ flowing in the comparison cell 37 is inputted in the sense amplifier 281 as a drain current $Id_r$.

In accordance with the structure shown in FIG. 6, even when the drain current $Id_{r1}$ flowing in the comparison cell 26 varies, the drain current $Id_{r2}$ is added to the drain current $Id_{r1}$. As a result, the magnitude of variation in the drain current $Id_r$ to be inputted in the sense amplifier 281 is reduced. In a similar manner, when the drain current $Id_{r2}$ flowing in the comparison cell 27 varies, the drain current $Id_{r4}$ is added to the drain current $Id_{r3}$. As a result, the magnitude of variation in the drain current $Id_r$ to be inputted in the sense amplifier 281 is reduced.

When a plurality of comparison cell pairs are provided and the comparison cells are connected in parallel with one another, the current ratio of current conversion performed by the sense amplifier 281 or 282 (i.e., $Id_r'/Id_r$ and $Id_w'/Id_w$) is preferably adjusted in accordance with the number of the comparison cell pairs. For example, when two comparison cell pairs are provided, a current ratio of the sense amplifier 281 is set at about one half (½) of the current ratio that is set for one comparison cell pair. When three comparison cell pairs are provided, a current ratio of the sense amplifier 281 is set at about one third (⅓) of the current ratio that is set for one comparison cell pair. Similar adjustment is made in the case of four or more pairs. Also, the current ratio of the sense amplifier 282 may be adjusted.

When the sense amplifier 281, 282 includes a current mirror circuit, the current ratio may be adjusted by adjusting the size of each transistor forming the current mirror circuit, as described below.

5. Embodiment of Read Circuit

The sense amplifier 281 includes P-type transistors 44, 45 and 46 and N-type transistors 47, 48, 49, 50 and 51. The transistors 44 and 48 form a voltage amplifier, and the transistors 45 and 46 form a current mirror circuit. Reference potential VREF determines the amplification factor of the voltage amplifier, and the amplification factor determines an upper level clamp potential VH and a lower level clamp potential VL on the line 68.

The sense amplifier 282 includes P-type transistors 54, 55 and 56 and N-type transistors 57, 58, 59, 60 and 61. The transistors 54, 57 and 60 form a voltage amplifier, and the. transistors 55 and 56 form a current mirror circuit. Reference potential VREF determines the amplification factor of the voltage amplifier, and the amplification factor determines an upper level clamp potential VH and a lower level clamp potential VL on the line 70.

The comparator section 21 includes an inverter circuit 62 that functions as a single input comparator.

The comparison cell selection circuit 22 includes N-type transistors 64 and 65, and an inverter circuit 66. An address signal A0 (LSB) is inputted in the gate of the transistor 65, and an inverted signal of the address signal A0 is inputted in the gate of the transistor 64.

Figure 7:
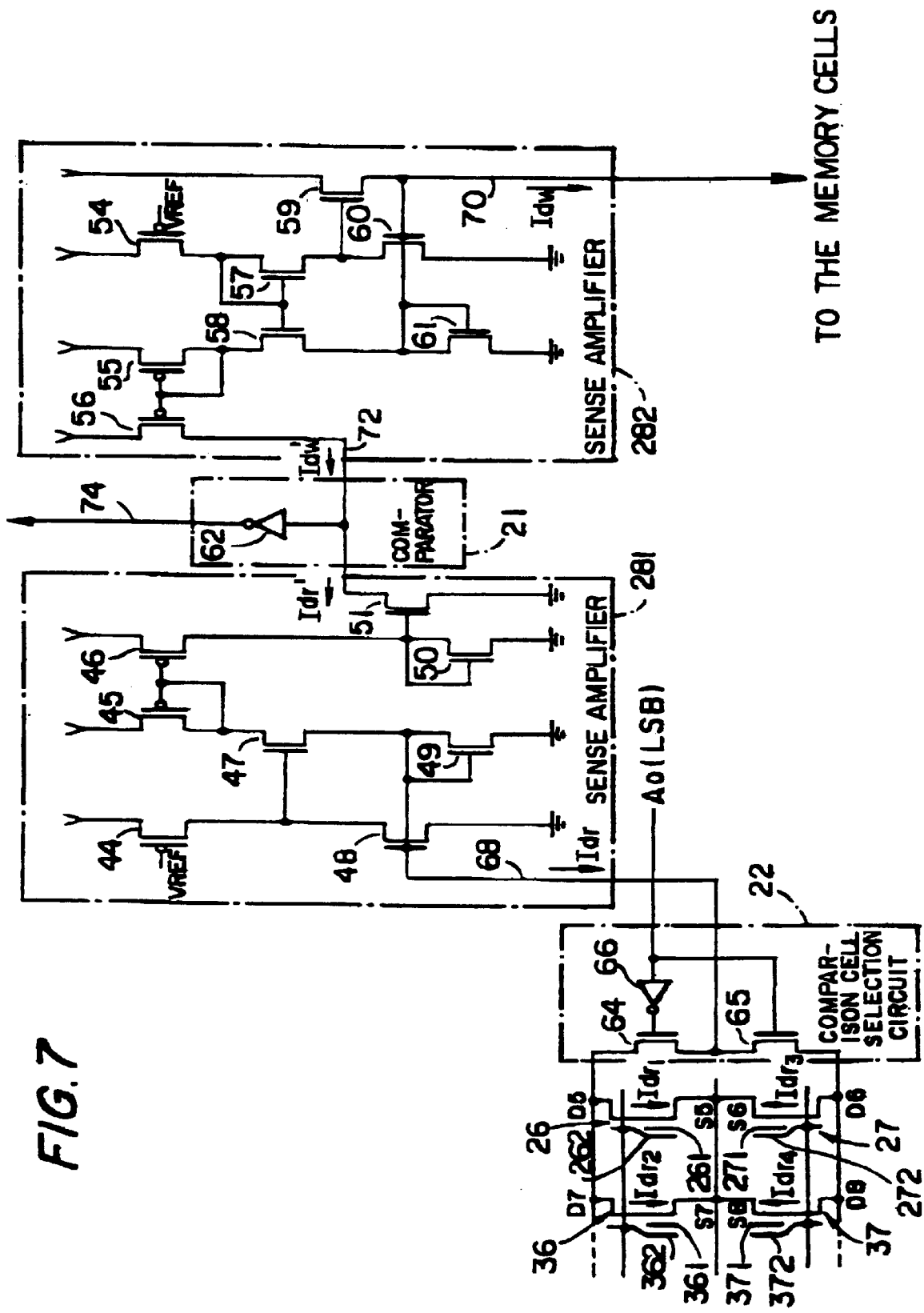
FIG. 7 is a detailed diagram of a read circuit.

An operation of the circuit shown in FIG. 7 will be described below. The comparison cells 26, 27, 36 and 37 are always in the erased state, namely, they are in an on-state. When the address signal A0 is "0", the transistor 64 turns on, and the comparison cells 26 and 36 are selected. As a result, $Id_r=Id_{r1}+Id_{r2}$. On the other hand, when the address signal A0 is "1", the transistor 65 turns on, and the comparison cells 27 and 37 are selected. As a result, $Id_r=Id_{r3}+Id_{r4}$.

The drain current $Id_r$ is current-converted to $Id_r'$ by the sense amplifier 281, and the sense amplifier provides $Id_r'$ to the comparator section 21. The current ratio for the current conversion is determined by, for example, a size ratio (W/L) between the transistors 45 and 46 that form the current mirror circuit. When two comparison cell pairs are provided, the size ratio between the transistors 45 and 46 is set, for example, at about 2 to 1, and when two comparison cell pairs are provided, the size ratio is set at about 3 to 1.

When a memory cell that is read is in the erased state (on-state), the current $Id_w$ flows. The current $Id_w$ is current-converted by the sense amplifier 282 (i.e., mirrored by the current mirror circuit) to a large current $Id_w'$ that is provided to the line 72. Since the current $Id_w'$ ($WS_{11}'$, $WS_{21}'$ shown in FIG. 4A) is greater than the current $Id_r'$ ($REF_{11}'$, $REF_{21}'$), the potential of the line 72 is put to a high (H) level by the transistor 56, and the output 74 of the comparator section 21 is put to a low (L) level.

On the other hand, a memory cell that is read is in the written state (off-state), the current $Id_w$ becomes almost zero (0). The current $Id_w$ is current-converted by the sense amplifier 282 (i.e., mirrored by the current mirror circuit) to a small current $Id_w'$ that is provided to the line 72. Since the current $Id_w'$ ($WS_{11}'$, $WS_{21}'$ shown in FIG. 5A) is smaller than the current $Id_r'$ ($REF_{11}'$, $REF_{21}'$), the potential of the line 72 is put to a low (L) level by the transistor 51, and the output 74 of the comparator section 21 is put to a high (H) level.

Accordingly, by detecting the level of the output 74 of the comparator section 21, a determination can be made as to whether a memory cell that is read is in the erased state or in the written state.

The semiconductor memory apparatus thus structured in accordance with the present embodiment provides the following effects.

(1) The margin for determining read signals is made uniform for each memory cell.
(2) Multiple values can be stored in each memory cell.
(3) The production yield is increased, and the service life of a semiconductor memory apparatus is substantially extended.
(4) Mask alignment errors can be allowed.
(5) Higher integration of semiconductor memory apparatuses is promoted.

It is noted that the present invention is not limited to the embodiments described above, and a variety of modifications can be made within the essence of the present invention.

For example, in accordance with the present invention described above, two values ("0" and "1") are stored in a memory cell. However, since a large determination margin is provided for all of the memory cells in accordance with the present embodiment described above, it is obvious that four values or eight values can be stored in a single memory cell.

Also, in accordance with the present embodiments described above, the present invention is implemented in split-gate type memories, such as, for example, EEPROM and EPROM. However, the present invention is not limited to the embodiments described above, but also applicable to a variety of other memory types, such as, for example, mask ROMS, DRAMs, SRAMs and the like.

Figure 8:
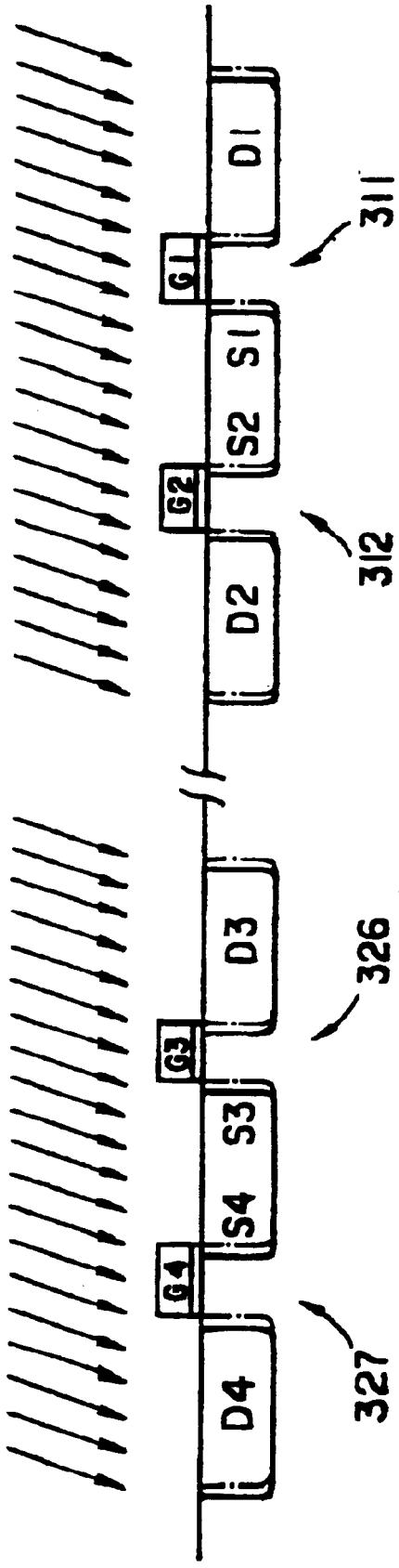
FIG. 8 is an explanatory view of an embodiment in which the present invention is applied to an apparatus other than flash-memories.

In particular, as shown in FIG. 8, when the drain regions D1, D2, D3 and D4 and the source regions S1, S2, S3 and S4 of the memory cells 311 and 312 and the comparison cells 326 and 327 are formed by impurities that are diagonally implanted, the structure of the present invention becomes effective. A semiconductor substrate is composed of a single crystal of tetragonal lattices. Therefore, when ions are vertically implanted, ion implantation is prevented in areas where atoms are superposed on top of another, and ions are deeply implanted in areas where atoms are not superposed. As a result, two peaks of impurity concentration in the direction of the depth are formed, which makes the ion implantation control difficult. In contrast, when ions are diagonally implanted, the ions are uniformly implanted in the direction of depth, resulting in one peak of impurity concentration. Accordingly, the ion implantation control is facilitated, and therefore a single peak of impurity concentration can be formed adjacent the surface of the semiconductor substrate. As a consequence, the drain capacitance can be reduced, and miniaturization of devices with much higher speed is promoted.

However, as shown in FIG. 8, since the memory cells 311 and 312 are disposed with the common source regions S1 and S2 being located between the memory cells, the current characteristics (gate-source voltage v. drain current characteristic and drain-source voltage v. drain current characteristic) of the memory cells 311 and 322 differ from one another if ions are diagonally implanted. In the memory cell 311, the drain region D1 shifts toward the gate G1, and the source region S1 shifts away from the gate G1. On the other hand, in the memory cell 312, the drain region D2 shifts away from the gate G2, and the source region S2 shifts toward the gate G2. In particular, when a device is miniaturized, the difference in the current characteristic becomes serious problems, and the higher integration of memories is prevented.

In accordance with the present embodiment, the comparison cells 326 and 327 are provided with the common source regions S3 and S4 disposed between the comparison cells. Further, the comparison cell 326 is oriented in the same direction of the memory cell 311 and the comparison cell 327 is oriented in the same direction of the memory cell 312. As a result, it is expected that when ions are diagonally implanted, the comparison cell 326 and the memory cell 311 have the same current characteristic, and the comparison cell 327 and the memory cell 312 have the same current characteristic. The memory cell 311 is read with the use of the comparison cell 326, and the memory cell 312 is read with the use of the comparison cell 327. As a consequence, even when the memory cells 311 and 312 have different current characteristics due to the diagonal ion implantation, a large determination margin can be secured for reading the memory cells, and therefore higher production yield and higher memory integration are achieved.

What is claimed is:

1. A semiconductor memory apparatus comprising:
a memory cell array including a first cell group of memory cells of a specified row, a second cell group of memory cells of one of a row immediately before the specified row and a row immediately after the specified row, a common memory cell source line for both of the cell groups disposed therebetween, wherein the memory cells in the first cell group and the memory cells in the second cell group of a specified column form memory cell pairs, and source regions of the memory cells of the first and second cell groups are connected to the memory cell source line;
at least one comparison cell pair of first and second comparison cells and a common comparison cell source line for the first and second comparison cells disposed therebetween, one of the first and second comparison cells being oriented in the same direction as the memory cells in the first cell group and the other of the first and second comparison cells being oriented in the same direction as the memory cells in the second cell group, and source regions of the first and second comparison cells being connected to the comparison cell source line; and
a read circuit that reads the memory cells corresponding to given physical addresses of the memory cell array;
wherein each of the memory cells and the first and second comparison cells has a split-gate type structure formed from components that are formed by the same manufacturing process on a common substrate;
the read circuit includes a comparison cell selection circuit that selects one of the first and second comparison cells that form the comparison cell pair; and
when reading a memory cell, the comparison cell selection circuit selects one of the first and second comparison cell that is oriented in the same direction as the memory cell to be read.

2. A semiconductor memory apparatus according to claim 1, wherein the comparison cell selection circuit selects one of the comparison cells in response to a least significant bit (LSB) of a physical address of the memory cell to be read out.

3. A semiconductor memory apparatus according to claim 1, comprising a plurality of the comparison cell pairs wherein drain regions of the first comparison cells included in the plurality of the comparison cell pairs are connected together, and drain regions of the second comparison cells included in the plurality of the comparison cell pairs are connected together.

4. A semiconductor memory apparatus according to claim 3, wherein the read circuit comprises:
a first sense amplifier that converts a first current flowing in the memory cell to be read out to a second current, a second sense amplifier that converts a third current flowing in the comparison cell pairs to a fourth current, and a comparator section that compares the second current from the first sense amplifier and the fourth current from the second sense amplifier, wherein at least one of a first current ratio between the first current and the second current and a second current ratio between the third current and the fourth current is adjusted to a value corresponding to the number of the comparison cell pairs.

5. A semiconductor memory apparatus according to claim 4, wherein the first sense amplifier includes a first current mirror circuit, and the second sense amplifier includes a second current mirror circuit, wherein each transistor forming the first current mirror circuit and the second current mirror circuit has a size that is adjusted according to the number of the comparison cell pairs.

6. A semiconductor memory apparatus comprising:

a memory cell array including a first cell group of memory cells of a specified row, a second cell group of memory cells of one of a row immediately before the specified row and a row immediately after the specified row, a common memory cell source line for both of the cell groups disposed therebetween, wherein the memory cells in the first cell group and the memory cells in the second cell group of a specified column form memory cell pairs, and source regions of the memory cells of the first and second cell groups are connected to the memory cell source line;

at least one comparison cell pair of first and second comparison cells and a common comparison cell source line for the first and second comparison cells disposed therebetween, one of the first and second comparison cells being oriented in the same direction as the memory cells in the first cell group and the other of the first and second comparison cells being oriented in the same direction as the memory cells in the second cell group, and source regions of the first and second comparison cells being connected to the comparison cell source line; and a read circuit that reads the memory cells corresponding to given physical addresses of the memory cell array;

wherein each of the memory cells and the first and second comparison cells has a structure formed from components that are formed by the same manufacturing process on a common substrate;

the read circuit includes a comparison cell selection circuit that selects one of the first and second comparison cells that form the comparison cell pair; and when reading memory cells, the comparison cell selection circuit selects one of the first and second comparison cells that is oriented in the same direction as the memory cells to be read.

7. A semiconductor memory apparatus according to claim 6, wherein source regions and drain regions of the memory cells and the first and second comparison cells are formed with impurities being diagonally ion-implanted.

8. A semiconductor memory apparatus according to claim 6, wherein the comparison cell selection circuit selects one of the comparison cells in response to a least significant bit (LSB) of a physical address of the memory cell to be read out.

9. A semiconductor memory apparatus according to claim 6, comprising a plurality of the comparison cell pairs wherein drain regions of the first comparison cells included in the plurality of the comparison cell pairs are connected together, and drain regions of the second comparison cells included in the plurality of the comparison cell pairs are connected together.

10. A semiconductor memory apparatus according to claim 9, wherein the read circuit comprises:

a first sense amplifier that converts a first current flowing in the memory cell to be read out to a second current, a second sense amplifier that converts a third current flowing in the comparison cell pairs to a fourth current, and a comparator section that compares the second current from the first sense amplifier and the fourth current from the second sense amplifier, wherein at least one of a first current ratio between the first current and the second current and a second current ratio between the third current and the fourth current is adjusted to a value corresponding to the number of the comparison cell pairs.

11. A semiconductor memory apparatus according to claim 10, wherein the first sense amplifier includes a first current mirror circuit, and the second sense amplifier includes a second current mirror circuit, wherein each transistor forming the first current mirror circuit and the second current mirror circuit has a size that is adjusted according to the number of the comparison cell pairs.

* * * * *